United States Patent
Fukui et al.

(10) Patent No.: US 6,962,751 B2
(45) Date of Patent: Nov. 8, 2005

(54) AMORPHOUS CARBON COATED TOOLS AND METHOD OF PRODUCING THE SAME

(75) Inventors: Haruyo Fukui, Itami (JP); Yoshiharu Utsumi, Itami (JP); Miki Irie, Itami (JP); Hisanori Ohara, Itami (JP); Hideki Moriguchi, Itami (JP); Satoru Kukino, Itami (JP); Makoto Setoyama, Kyoto (JP); Satoshi Ohtani, Kyoto (JP); Naoto Okazaki, Kyoto (JP); Kiyoshi Ogata, Kyoto (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 157 days.

(21) Appl. No.: 10/167,751

(22) Filed: Jun. 11, 2002

(65) Prior Publication Data

US 2003/0054171 A1 Mar. 20, 2003

(30) Foreign Application Priority Data

Jun. 13, 2001 (JP) ........................................ 2001-178887

(51) Int. Cl.$^7$ ............................................... B23B 27/14
(52) U.S. Cl. ........................... 428/408; 51/307; 51/309; 407/119; 428/212; 428/216; 428/156; 428/174; 428/325; 428/698
(58) Field of Search ................................ 428/408, 698, 428/336, 216, 472, 469, 325, 174, 156, 212; 407/119; 51/307, 309

(56) References Cited

U.S. PATENT DOCUMENTS

| 4,842,937 A | | 6/1989 | Meyer et al. |
| 5,474,816 A | | 12/1995 | Falabella |
| 5,482,602 A | * | 1/1996 | Cooper et al. |
| 5,562,982 A | | 10/1996 | Hiwatashi |
| 5,567,512 A | | 10/1996 | Chen et al. |
| 5,733,668 A | * | 3/1998 | Kameoka et al. |

(Continued)

FOREIGN PATENT DOCUMENTS

| EP | 561641 | | 9/1993 |
| EP | 1067211 | | 1/2001 |
| EP | 724023 | | 7/2001 |
| JP | 01252752 | | 10/1989 |
| JP | 07018415 | | 1/1995 |
| JP | 07-085465 | * | 3/1995 |
| JP | 07-192254 | * | 7/1995 |
| JP | 08119774 | | 5/1996 |
| JP | 09-314405 | * | 12/1997 |
| JP | 10-025565 | * | 1/1998 |
| JP | 11-018809 | * | 1/1999 |
| JP | 11-086275 | * | 3/1999 |
| JP | 2000-176705 | | 6/2000 |
| JP | 2001-062605 | | 3/2001 |

OTHER PUBLICATIONS

Lifshitz "Hydrogen free amorphous carbon films: correlation between growth conditions and properties" Diamond and Related Materials 5 (1996) 388–400.*

J.P. Hirvonen et al.; "Characterization and Unlubricated Sliding of Ion–Beam–Deposited Hydrogen–Free Diamond–Like Carbon Films", Wear, Lausanne, CH. vol. 141, 1990, pp. 45–58, XP000570574.

(Continued)

Primary Examiner—Archene Turner
(74) Attorney, Agent, or Firm—W. F. Fasse; W. G. Fasse (57) ABSTRACT

Amorphous carbon coated tools include substrates formed from a cubic boron nitride sintered body, a diamond sintered body, a silicon nitride sintered body, or an aluminum oxide-titanium carbide sintered body, and amorphous carbon films thereon to make the cutting edges of the tools. The amorphous carbon films contain hydrogen at 5 atomic percent or below and have a maximum thickness of 0.05 $\mu$m to 0.5 $\mu$m on the cutting edges. The amorphous carbon films are most suitable for applications to cutting tools exemplified by cutters, knives, and slitters, and to indexable inserts used for example in turning tools including drills, endmills, and reamers, and milling cutters.

18 Claims, 2 Drawing Sheets

U.S. PATENT DOCUMENTS

| | | | |
|---|---|---|---|
| 5,763,087 A | * | 6/1998 | Falabella |
| 6,110,329 A | | 8/2000 | Holleck et al. |
| 6,110,584 A | | 8/2000 | Hiratsuka et al. |
| 6,139,964 A | | 10/2000 | Sathrum et al. |
| 6,284,376 B1 | * | 9/2001 | Takenouchi et al. |
| 6,726,993 B2 | | 4/2004 | Teer et al. |

OTHER PUBLICATIONS

B. F. Coll et al.; "Diamond–Like Carbon Films Synthesized by Cathodic Arc Evaporation", Thin Solid Films, Elsevier–Sequoia S. A. Lausanne, CH., vol. 209, No. 2, Mar. 30, 1992; pp. 165–173 XP000362002, ISSN: 0040–6090.

S. Santavirta et al., "Some Relevant Issues Related to the Use of Amorphous Diamond Coatings for Medical Applications", Diamond and Related Materials, Elsevier Science Publishers, Amsterdam, NL, vol. 7, No. 2–5, Feb. 1, 1998, pp. 482–485, XP004115090, ISSN: 095–9635.

J. Ullmann, "Low Energy Ion Assisted Carbon Film Growth: Methods and Mechanisms", Nuclear Instruments & Methods in Physics Research, Section—B: Beam Interactions With Materials and Atoms, North–Holland Publishing Company, Amsterdam, NL, vol. 127–128, May 1, 1997, pp. 910–917, XP004096874, ISSN: 0168–583X.

Y. Lifshitz, "Diamond–like Carbon—Present Status", Diamond and Related Materials, Elsevier Science Publishers, Amsterdam, NL., vol. 8, No. 8–9, Aug. 1999, pp. 1659–1676, XP004254004, ISSN: 0925–9635.

M. Hakovirta, "Hardmetal Woodcutting Tool Tips Coated With Tetrahedral Amorphous Carbon", Diamond and Related Materials, Elsevier Science Publishers, Amsterdam, NL., vol. 8, No. 7, Jul. 1999, pp. 1225–1228, XP004253920, ISSN: 0925–9635.

R. Kalish et al., "Thermal Stability and Relaxation In Diamond–Like–Carbon., A Raman Study of Films with Different SP3 Fractions (TA–C to A–C)", Applied Physics Letters, American Institute of Physics, New York, US, vol. 74, No. 20, May 17, 1999, pp. 2936–2938, XP000834705, ISSN: 0003–6951.

M. Bonelli et al., "Structural and mechanical properties of ta–C films grown by pulsed laser deposition", Europhysics Letters, May 15, 2000, Eur. Phys. Soc. by EDP Sciences and Soc. Italiana Fisica, France, vol. 50, No. 4, pp. 501–506, XP008027117, ISSN: 0295–5075.

* cited by examiner

AMORPHOUS CARBON COATED TOOLS AND METHOD OF PRODUCING THE SAME

CROSS-REFERENCE TO RELATED APPLICATION

This application is related to U.S. application Ser. No. 10/167,770, filed Jun. 11, 2002.

BACKGROUND OF THE INVENTION

1. Field of the Invention

The present invention relates to tools coated by amorphous carbon films having wear resistance and an antiadhesion feature, said tools including cutting-off tools (represented by cutters, knives, and slitters) and indexable inserts used for example in turning tools and face milling cutter and milling cutters (exemplified by drills, endmills, and reamers).

2. Description of the Background Art

Conventional cutting tools and wear-resistant tools have hard coatings on the surface of substrates to enhance wear resistance and the protection of the tool surface. The substrates consist of such known materials as a WC-based sintered hard alloy, cermet, and high-speed steel. It is also known that the hard coatings comprise either a single layer or multiple layers of one or more of titanium carbide, hafnium carbide, zirconium carbide, titanium nitride, hafnium nitride, zirconium nitride, titanium carbonitride, hafnium carbonitride, zirconium carbonitride, and aluminum oxide that are produced through physical vapor deposition or chemical vapor deposition.

In recent trends, however, cutting tools are used in operation at a higher speed to improve processing efficiency, thus increasing the temperature on the cutting edges thereof. Demands for specific improvements in tool materials have also become stringent. It is therefore essential to produce hard coatings that are more stable at high temperatures, that is, more oxidation-resistant and more adhered to the substrates. In addition, it has also become of growing importance to enhance the wear resistance of the hard coatings, namely hardness, for longer life of the cutting tools.

Particularly in fields where high levels of hardness and strength are required, a tool comprising a substrate formed from one of a cubic boron nitride sintered body, a diamond sintered body, a silicon nitride sintered body, or an aluminum oxide-titanium carbide sintered body is used. A tool having said hard coating on the surface of the substrate has been proposed.

For example, Japanese Patent Laying Open No. Tokukaihei No. 7-18415 proposes a cBN-based ceramic cutting tool covered by a single hard layer or multiple hard layers having an average thickness of 5 $\mu$m to 20 $\mu$m. Said single hard layer is formed from one selected from the group of TiC, TiN, TiCN, TiCO, TiCNO, and $Al_2O_3$, while said multiple hard layers consist of two or more of the same group. Japanese Patent Laying Open No. Tokukaihei No. 8-119774 also proposes a tool incorporating a substrate of either a cBN sintered body or a diamond sintered body, and at least one hard and thermal-resistant layer thereon to cover at least the tool part relevant to the cutting process. Said layer contains at least one element of C, N, and O, together with the primary constituents of Ti and Al.

In recent years, workpiece materials to be cut have become diverse, including such soft metals as aluminum alloys; nonferrous metals including titanium, magnesium, and copper; organic materials; materials containing hard particles like graphite; printed circuit boards; and the combination of a ferrous material and aluminum for bi-metallic cutting. Bi-metallic cutting is herein defined as the simultaneous cutting process of a ferrous material adhered to aluminum. In machining the workpiece materials herein listed, the edge of a cutting tool is susceptible to such accumulation and adhesion of said workpiece materials that increase cutting resistance. In some cases, the cutting edge is chipped during the process. These specific workpiece materials tend to cause far greater wear of the cutting tool than do other workpiece materials.

Diamond tools have conventionally been used in specific applications including the processing of soft metals such as aluminum and aluminum alloys, nonferrous metals represented by titanium, magnesium, and copper, materials containing hard particles like graphite, organic materials, printed circuit boards; and the bimetallic cutting of a ferrous material adhered to aluminum. Tools having diamond films formed on substrates tend to have a rough surface due to the polycrystalline structures of the films. It is necessary, therefore, to polish the tool surface for applications in precision processing.

However, as a diamond film is the hardest among the existing materials, there is no other alternative but to use diamond for surface polishing, and this has made the cost higher.

TiN or other ceramic films obtained through physical vapor deposition are usually as thick as 2 $\mu$m to 3 $\mu$m. On the other hand, a diamond film needs to have a thickness of 20 $\mu$m to 30 $\mu$m initially. This is due to the fact that diamond crystals grow at greatly varying speeds depending on their crystal orientation and the formed film is subjected to polishing to obtain a smoother surface. In addition, it is necessary to carry out etching and remove graphite that also grows during the diamond film deposition. This has decreased the film formation speed to one-tenth of the speed that ceramic coats require, and made the production including the coating process extremely expensive.

As with a tool wherein one of a diamond sintered body, a cBN sintered body, a silicon nitride sintered body, or an aluminum oxide-titanium carbide sintered body is brazed to a substrate, there has existed the problem of providing a complicated shape and a diameter as small as a few millimeters. When applied to a cutting tool, those materials are insufficiently tough so as to cause the cutting edge thereof to chip easily, abruptly ending the short lifetime.

Thus the present invention mainly aims to provide amorphous carbon coated tools for applications including the machining of soft metals, nonferrous metals, organic materials, materials containing hard particles, printed circuit boards, and the bimetallic cutting of a ferrous material adhered to a soft metal. As the tool surface has an excellent smooth feature, said tools effectively protect the cutting edges from chipping and cause less corroded workpiece materials to accumulate thereon. Furthermore, a high thermal conductivity of said tools curbs a temperature increase on said cutting edges and enables applications under severe conditions such as dry cutting and high-speed machining. Another object of the present invention is to provide the method of producing said tools.

SUMMARY OF THE INVENTION

The aforementioned objects of the present invention can be attained by specifying the composition of said substrates and the thickness of amorphous carbon films thereon.

An amorphous carbon coated tool recited in the present invention comprises a substrate of one selected from the group of a cBN sintered body, a diamond sintered body, a silicon nitride sintered body, and an aluminum oxide-titanium carbide sintered body; and an amorphous carbon film covering at least the cutting edge thereof Said amorphous carbon film is characterized by hydrogen contained at 5 atomic percent or below and a maximum thickness of 0.05 μm or more to 0.5 μm or less on the cutting edge.

Another amorphous carbon coated tool herein provided comprises a substrate of one selected from the group of a cBN sintered body, a diamond sintered body, a silicon nitride sintered body, and an aluminum oxide-titanium carbide sintered body; and an amorphous carbon film covering at least the cutting edge thereof. Said amorphous carbon film is characterized in that graphite is used as a raw material and formed into a film through physical vapor deposition in an atmosphere substantially reducing hydrogen, and the formed film has a maximum thickness of 0.05 μm or more to 0.5 μm or less on the cutting edge.

The amorphous carbon coated tool production method according to the present invention comprises a step of holding a substrate of one selected from the group of a cBN sintered body, a diamond sintered body, a silicon nitride sintered body, and an aluminum oxide-titanium carbide sintered body in a vacuum chamber; and another step of applying a zero or negative DC bias voltage to said substrate while evaporating graphite and enabling the formation of an amorphous carbon film. Said method is also characterized by limiting the maximum thickness of said amorphous carbon film to a range from 0.05 μm to 0.5 μm on the cutting edge of said tool.

DETAILED DESCRIPTION OF THE INVENTION

The following are details of preferred embodiments and compositions in implementing the present invention.

A Substrate Comprising a Sintered Body

A Substrate of a Diamond Sintered Body

It is preferable that the diamond sintered body contain diamond at 40 volume percent or over. More preferably, the diamond sintered body has such a composition as follows.

(1) The diamond sintered body contains diamond from 50 volume percent to 98 volume percent and the remaining part consisting of a ferrous metal, WC, and inevitable impurities. It is particularly desirable that said ferrous metal is Co.

(2) The diamond sintered body contains diamond from 85 volume percent to 99 volume percent and the remaining part formed of pores, WC, and inevitable impurities.

(3) The diamond sintered body contains diamond from 60 volume percent to 95 volume percent and the remaining part consisting of WC; inevitable impurities; and at least one selected from the group of ferrous metals and the carbides and carbonitrides of elements belonging to the IVa, Va, and VIa groups in the periodic table. It is further preferable that the remaining part comprise a binder of Co, TiC, WC, and inevitable impurities.

(4) The diamond sintered body contains diamond from 60 volume percent to 98 volume percent, and the remaining part formed of tungsten carbide, inevitable impurities, and either silicon or silicon carbide.

A Substrate of a cBN Sintered Body

It is preferable that the cBN sintered body contain cBN at 30 volume percent or over. More preferably, the cBN sintered body has a composition described below.

(1) The cBN sintered body contains cBN from 30 volume percent or more to 80 volume percent or less and the remaining part formed from at least one selected from the group of the nitride, boride, carbide, and solid solution of an element belonging to the IVa, Va, and VIa groups in the periodic table; a binder comprising an aluminum compound; a ferrous metal and inevitable impurities.

In the cBN sintered body having said composition, cBN particles are bonded mainly by said binder having low affinity with iron. The bond is sufficiently strong so as to improve the wear resistance and the strength of the tool wherein said substrate is incorporated.

Said cBN sintered body must have cBN from 30 volume percent or more to 80 volume percent or less. When the percentage is lower than 30 volume percent, the cBN sintered body is not hard enough to cut hardened steel and other workpiece materials having a high hardness. The percentage of over 80 volume percent makes it difficult for a binder to bond cBN particles together and reduces the strength of the cBN sintered body.

(2) The cBN sintered body contains cBN from 80 volume percent or more to 90 volume percent or less, has cBN particles bonded, and also contains the remaining part formed from inevitable impurities and a binder mainly consisting of either an Al compound or a Co compound. In said cBN sintered body, either an Al or Co-contained metal that can act as a catalyst, or an intermetallic compound is used as a raw material and subjected to liquid-phase sintering to bond cBN particles together. Said liquid-phase sintering process makes it possible to increase the cBN particles contained in said cBN sintered body. With a high percentage of cBN particles, the cBN sintered body becomes less wear-resistant. On the other hand, the cBN particles have a strong skeleton structure that effectively protects the cutting edge of a tool from chipping and permits applications of the tool in the cutting processing under severe conditions.

Said cBN sintered body contains cBN from 80 volume percent or more to 90 volume percent or less. When the percentage is below 80 volume percent, it is difficult for cBN particles therein to bond together and form a skeleton structure. If the percentage exceeds 90 volume percent, the quantity of said binder comprising either said catalytic Al or Co-contained metal or said intermetallic compound is insufficient so as to leave a part of said body unsintered, thereby lowering the strength of the tool.

A Substrate of a Silicon Nitride Sintered Body

It is preferable that the silicon nitride sintered body contain silicon nitride at 90 volume percent. More preferably, said silicon nitride sintered body contain silicon nitride produced through hot isostatic pressing (HIP) of 90 volume percent or over. It is desirable that the remaining part of said silicon nitride sintered body be formed from inevitable impurities and a binder consisting of at least one selected from the group of aluminum oxide, aluminum nitride, yttrium oxide, magnesium oxide, zirconium oxide, hafnium oxide, rare earths, TiN, and TiC. The silicon nitride in said sintered body is set at 90 volume percent. If the silicon nitride is below 90 volume percent, the silicon nitride sintered body lacks in hardness

A Substrate of an Aluminum Oxide-titanium Carbide Sintered Body

It is preferable that the aluminum oxide-titanium carbide sintered body contain aluminum oxide from 20 volume percent to 80 volume percent and titanium carbide from 15 volume percent to 75 volume percent. Also preferably, the remaining part of said sintered body comprises inevitable impurities and a binder formed of one oxide of Mg, Y, Ca, Zr, Ni, Ti, or TiN. The aluminum oxide in said sintered body should be limited to the range of 20 volume percent to 80 volume percent. When the percentage is below 20 volume percent, it is difficult to achieve a predetermined density. With the percentage exceeding 80 volume percent, said body lacks in hardness and becomes less wear-resistant. The titanium carbide in said sintered body must be from 15 volume percent to 75 volume percent. If the percentage is below 15 volume percent, said sintered body has insufficient hardness and is less wear-resistant. With the percentage exceeding 75 volume percent, it is difficult to achieve a predetermined density.

An Amorphous Carbon Film

Amorphous carbon films include those generally called hard carbon films, diamond-like carbon (DLC) films, a-C:H films, and i-C films. On the other hand, an amorphous carbon film produced according to the present invention has the characteristics described below.

Film Deposition Methods

In the present invention, graphite is used as a raw material and formed into an amorphous carbon film through physical vapor deposition in an atmosphere substantially not containing hydrogen. The film has a high hardness equivalent to that of diamond and exhibits excellent wear-resistance features when incorporated in cutting tools. An amorphous carbon film employing hydrocarbon as a raw material contains hydrogen, which differentiates the film from those provided by the present invention.

The amorphous carbon film of the present invention is formed solely of carbon atoms except the inevitable impurities emerging during the film deposition process. This allows the film to achieve a higher ratio of $sp^3$ bonding than the hydrogen-contained amorphous carbon film, making it possible to improve hardness. At the same time, the oxidation resistant feature of the film can also be improved to nearly the same level as diamond, which begins oxidation at around 600° C. Though having been produced in an atmosphere substantially not containing hydrogen, the film may find hydrogen contained at about 5 atomic percent or below. It is conceivable that depending on the vacuum level during the film deposition process, hydrogen or water remaining inside the vacuum chamber may be absorbed in the amorphous carbon film.

Among the physical vapor deposition methods using graphite as a raw material, those usually employed in industries such as cathode arc ion plating, laser ablation, and sputtering deposition are very effective in forming amorphous carbon films at a high speed and solving the problem of high costs arising from diamond film production. Cathode arc ion plating is particularly desired for such film deposition in terms of the adhesiveness and hardness of the obtained film. By ionizing the raw material at a high level, the cathode arc ion plating method allows carbon ions to be irradiated on substrates to form an amorphous carbon film thereon. As a result, the ratio of $sp_3$ bonded carbons in said film is sufficiently high to make the film compact and very hard, thus lengthening the lifetime of the tool.

The temperature of the substrate is preferably in the range of 50° C. to 200° C. When the temperature is over 350° C., graghite is liable to deposit on the substrate instead of amorphous carbon. The temperature of the substrate increases during deposition of the amorphous carbon, because a carbon ion irradiates the substrate. The temperature of the substrate therefore may become practically in the suitable range for deposition without heating by a heater. On the other hand, the temperature of the substrate may be controlled by heating or cooling.

The temperature of the substrate is more preferably in the range of 50° C. to 150° C.

Macro Particle Density

On the surface of an amorphous carbon film produced through the cathode arc ion plating method, there exist hard particles called macro particles. A lower macro particle density is desirable, as it causes less resistance to the cutting process. The density should be up to $3 \times 10^5$ particles/mm$^2$, and more preferably, no more than $1.5 \times 10^5$ particles/mm$^2$. Needless to say that the ultimately desired density should be 0 particle/mm$^2$. If the density exceeds $3 \times 10^5$ particles/mm$^2$, workpiece materials tend to corrode and adhere to the macro particles, thereby increasing the cutting resistance.

The macro particle density on the amorphous carbon film can be evaluated by means of scanning electron microscope (SEM) observation. The SEM observation should be conducted after a precious metal like Pt or Pd is vapor deposited on the surface of a sample film through ion sputtering or other methods. A photograph should be taken of the sample film surface at a magnification of 1000 times or over. By counting the number of macro particles observed in the photograph, the macro particle density can be determined.

Figure 2:
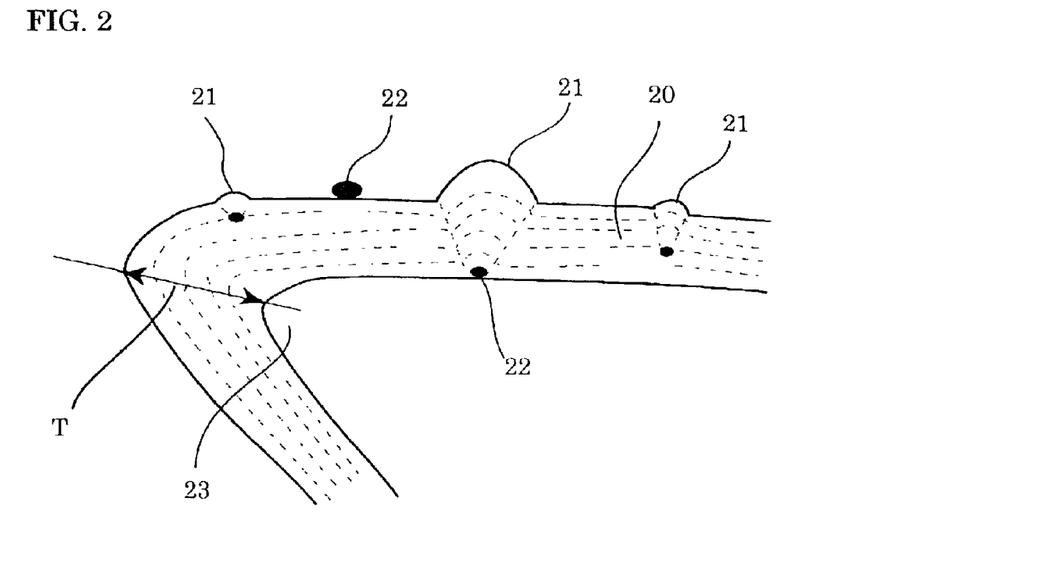
FIG. 2 is a cross section view of a cutting edge of a tool produced according to the present invention.

FIG. 2 is a cross sectional view of an amorphous carbon film 20 to show the growth of macro particles 21 thereon. The amorphous carbon film 20 is in the process of being deposited on a cutting edge 23 of a tool. During this process, graphite particles 22 are flying and falling on the film surface. The graphite particles 22 cause protrusions to appear on the film surface. By electron microscope examination, round grains 21 in different diameters are confirmed present on the film surface. However, the presence of the round grains 21 is undesirable according to the present invention. Since the graphite particles 22 tend to fly during the film formation process, the graphite particles 22 assumably exist in various depths of the amorphous carbon film 20 as illustrated in FIG. 2.

It is recommendable that such means as low-energy film deposition and magnetic field filtration are used to improve the surface smoothness of the amorphous carbon film, as they can prevent said round particles from flying out of the raw material of graphite.

Surface Roughness

The surface roughness of the amorphous carbon film is desirably in a range of 0.002 µm or more to 0.05 µm or less according to the Ra definition specified under the JIS standard B0601. Considering applications to a cutting tool, the film should have the smallest possible surface roughness (an Ra value). In actuality, however, the Ra value can never be lowered to zero. As a result of various cutting tests, it was discovered that when the Ra value was 0.05 μm or below, less workpiece material corroded and accumulated on the cutting edge and the cutting operation performance improved. It is also desirable that the surface roughness of the amorphous carbon film be in a range from 0.02 μm or more to 0.5 μm or less according to the Ry definition specified under the JIS standard B0601. With the Ry value exceeding 0.5 μm, protrusions (macro particles) on the surface of the amorphous carbon film may allow corroded workpiece material to accumulate thereon, leading to increased cutting resistance.

Thickness

An amorphous carbon film must be as thick as 0.05 μm to 0.5 μm at maximum on the cutting edge of a tool. If the thickness is below 0.05 μm, a problem arises in the wear resistance of the tool. With the thickness exceeding 0.5 μm, internal stress accumulated within the amorphous carbon film grows to the extent that it may cause the film to peel and chip. Specifying the film thickness as 0.5 μm or below allows small macro particles to exist less densely on the film surface. This is also effective in limiting the surface roughness to 0.05 μm or below (according to the aforementioned Ra definition), or to 0.5 μm or below (according to the aforementioned Ry definition). As indicated with a T in FIG. 2, the amorphous carbon film is thicker on the tip of the cutting edge. If the film is thinner on the tip, the machining performance of the tool improves. In light of anti-adhesion, it is preferred that the amorphous carbon film on the tool edge relevant to the cutting process have a maximum thickness of 0.05 μm or more to 0.25 μm or less.

Hardness

It is desirable that an amorphous carbon film have a Knoop hardness in a range from 20 GPa or more to 50 GPa or less. If the hardness is below 20 GPa, the amorphous carbon film may have insufficient wear resistance. With a hardness exceeding 50 GPa, the anti-chipping feature of the tool edge may deteriorate. More preferably, the amorphous carbon film has a Knoop hardness of 25 GPa or more to 40 GPa or less.

Raman Spectrum

It is extremely difficult to define the structure of an amorphous carbon film, due to its intrinsic quality. As a result of the evaluation of various amorphous carbon films, it was discovered that Raman spectrum showed differences in film structures.

Figure 3:
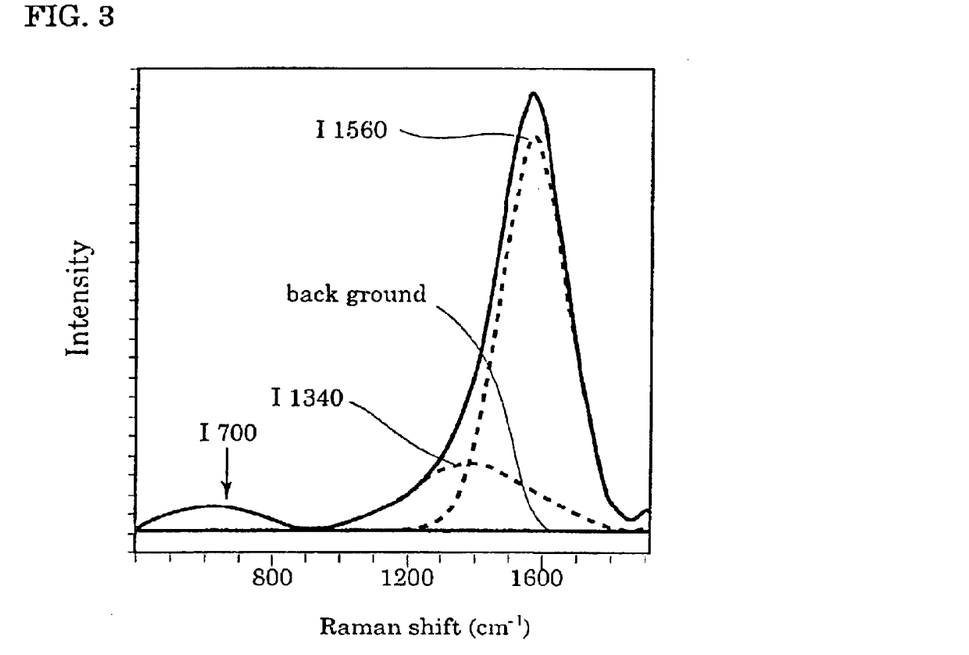
FIG. 3 is a Raman spectrum of an amorphous carbon film manufactured according to the present invention.
Figure 4:
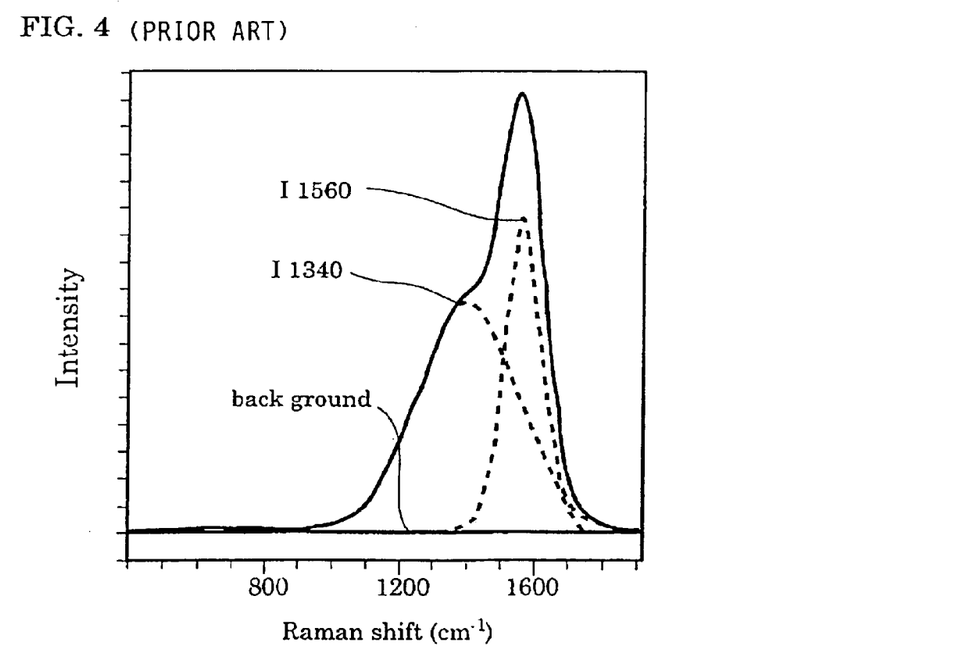
FIG. 4 is a Raman spectrum of an amorphous carbon film produced by a conventional method.

While FIG. 3 shows a Raman spectrum of an amorphous carbon film produced according to the present invention, FIG. 4 is a Raman spectrum of a conventional hydrogen-contained amorphous carbon film. Both spectra were obtained through the Raman spectrum analysis employing an argon gas laser with a wavelength of 514.5 nm. The result of the measurement is shown by a solid line in FIG. 4, which has a peak at around 1340 $cm^{-1}$ as opposed to around 700 $cm^{-1}$.

Secondly, background signals were subtracted from the obtained spectra to break down said spectra into two partial spectra respectively. On the assumption that the two spectra having peaks indicate values to which two Gauss functions have been applied, the values were approximated by means of a non-linear least square regression to separate them into two peaks respectively. The obtained results are shown in chain lines. The heights of pronounced peaks found around 1340 $cm^{-1}$ and 1560 $cm^{-1}$ are indicated respectively as I1340 and I1560. In contrast, as shown by the solid line in FIG. 3, it was difficult to identify the presence of a peak at around 1340 $cm^{-1}$ in the original Raman spectrum of the film produced according to the present invention. Instead, a broad and slight rise was confirmed present at around 700 $cm^{-1}$. The spectrum was also broken down into two partial spectra in the aforementioned method, and the result is indicated by chain lines in FIG. 3. In a comparison between FIGS. 3 and 4, it is apparent that the peak at around 1340 $cm^{-1}$ in FIG. 3 is not as high or sharp as the peak appearing in the same wave number region in FIG. 4. The intensity of the peak at around 700 $cm^{-1}$ is indicated as I700. The individual peaks were calculated into integral values as referenced for example by S700.

In the amorphous carbon film produced according to the present invention, peaks were observed in three wave number regions: from 400 $cm^{-1}$ or more to 1000 $cm^{-1}$ or less, around 1340 $cm^{-1}$, and around 1560 $cm^{-1}$. With a conventional hydrogen-contained film, however, no peak was detected in lower wave numbers from 400 $cm^{-1}$ or more to 1000 $cm^{-1}$ or less. A structure having a peak in the wave number region from 400 $cm^{-1}$ to 1000 $cm^{-1}$ enables the film to improve hardness and wear resistance.

Furthermore, the wear resistance of the tool improves, if the ratio (I700/I1340) of the peak intensity located in the wave number range from 400 $cm^{-1}$ or more to 1,000 $cm^{-1}$ or less (I700) and the peak intensity occurring around 1340 $cm^{-1}$ (I1340) is in a range from 0.01 or more to 2.5 or less. It can be assessed that an increase in the amount of either tiny graphite or $sp^3$ bonded carbons having strain allowed the amorphous carbon film to achieve a high level of hardness.

Aside from the aforementioned evaluation method using a peak intensity, an assessment can be made by means of an integral intensity ratio of the obtained peaks. Preferably, the ratio (S700/S1340) of the integral intensity located in the wave number region from 400 $cm^{-1}$ to 1,000 $cm^{-1}$ (S700) and the integral intensity found around 1340$cm^{-1}$ (S1340) should be in a range of 0.01 to 2.5. If said ratio is below 0.01, the amorphous carbon film has the same level of wear resistance as the conventional film. Although a variety of film deposition tests were conducted as described hereinafter, an amorphous film having the integral intensity ratio of 2.5 or over was not obtained.

An amorphous carbon favorably exhibits a high level of wear resistance, when the ratio (I1340/I1560) of the peak intensities occurring around 1560 $cm^{-1}$ (I1560) and around 1340 $cm^{-1}$ (S1340) is in a range from 0.1 or more to 1.2 or less. The I1340/I1560 ratio is also interpreted as an $sp^2/sp^3$ ratio and indicates the amount of bonded carbons present inside the amorphous carbon film. Although the ratio does not directly indicate the amount of $sp^2$ bonded carbons in the film, it provides an instrument for relative structure evaluation. It was found that if there was a pronounced peak around 1560 $cm^{-1}$, the film became harder. With a strong $sp^3$ bond, the wear resistance of the film improved. Aside from the peak intensity, the ratio (S1340/S1560) of the peak integral intensities occurring around 1560 $cm^{-1}$ (S1560) and around 1340 $cm^{-1}$ (S1340) should be in a range from 0.3 or more to 3 or less.

When the peak occurring around 1560 $cm^{-1}$ exists in the wave number region from 1560 $cm^{-1}$ or more to 1580 $cm^{-1}$ or less, a high level of wear resistance can be achieved. The location of a peak in a Raman spectrum varies depending on the stress state inside the film. In general, if compression is strong, the peak shows a shift to a high wave number region. In contrast, when tension is strong, the peak location is shifted to a lower wave number region. It was found that where there was strong compression in the film, the wear resistance of the film improved.

Interference Color

Amorphous carbon films employed for the prior art are not transparent in the visible light range, and have a dark brown or black color. In contrast, the amorphous carbon film produced according to the present invention is characterized by its transparency in the visible light range and its interference color.

An amorphous carbon film having an interference color denotes the abundance of $sp_3$ bonded carbons therein. At the same time, it shows that the film has the physical features of a refractive index, optical band gap, and elasticity more similar to diamond than to conventional amorphous carbon films. When applied in tools, the film produced according to the present invention exhibits a high level of resistance to wear and heat due to a high level of hardness. Thus, tools wherein the present invention is optimized have a noticeable characteristic of interference colors.

According to an increase in the thickness of the amorphous carbon film, its color also changes from (1) brown, (2) reddish purple, (3) purple, (4) bluish purple, (5) blue, (6) silver, (7) yellow, (8) red, (9) blue, (10) green, (11) yellow, to (12) red. After reaching (12) red, the color again changes into (8) red, and continues to change in the same manner until it becomes (12) red. These color changes are sequential relative to the film thickness. When said thickness is between two of the aforementioned color indices, the film shows an intermediate or transitional color.

Assessments made by inventors resulted in a finding that if the maximum thickness of the film on the cutting edge is specified as a range from 0.05 $\mu$m to 0.5 $\mu$m, the film should be in a color from (2) reddish purple to (10) green. The color should not necessarily be pure; iridescent colors are acceptable. Furthermore, it is also effective to cover an amorphous carbon film with a conventional amorphous film in dark brown or black.

Interlayer

It is preferable that a tool produced according the present invention have an interlayer between a substrate and an amorphous carbon film thereon to allow a stronger adherence of the film to the substrate.

Material

It is preferable that said interlayer is formed from at least one element selected from the group consisting of an element from groups IVa, Va, VIa, III b of the periodic table and an element from group IVb of the periodic table except C, or at least one carbide of an element selected from the aforementioned groups.

More preferably, the interlayer is formed from at least one element selected from the group consisting of elements Ti, Zr, Hf, V, Nb, Ta, Cr, Mo, W, and Si, or at least one carbide of an element selected from the aforementioned group. As these metal elements can easily create a strong bond with carbon, having an amorphous carbon film on the interlayer comprising either an aforementioned metal element or an aforementioned metal carbide allows a stronger adherence of the film to the substrate.

Thickness

The thickness of the interlayer should be 0.5 nm or over, but no more than 10 nm. Being thinner than the minimum limit, the interlayer does not function as anticipated. When the thickness exceeds the maximum limit, the adhesiveness of the film is at the same level as films provided by the prior art. Inserting such an extremely thin interlayer makes it possible to achieve the stronger adhesion between the film and the substrate than the prior art could offer. This may also lead to a remarkable improvement of the lifetime of the tools.

Mixed Composition Layer and Gradient Composition Layer

It is further desirable that either a mixed composition layer or a gradient composition layer is inserted between the amorphous carbon film and the interlayer to achieve far stronger adhesion. While a mixed composition layer forms a mixture of the composition of each film, a gradient composition layer has a sequentially changing composition therein. These two layers cannot be clearly distinguished. When the production conditions are altered from the formation of an interlayer to the deposition of an amorphous carbon film, these different compositions usually mix and form either a mixed composition layer or a gradient composition layer. Difficult as it is to confirm directly the presence of such layers, it can be construed from the results of examination using X-ray Photo-electronic Spectroscopy (XPS) and Auger Electron Spectroscopy (AES).

Applications of Tools

The amorphous carbon coated tools of the present invention are appropriate for the processing of aluminum and aluminum alloys, as the tools have excellent wear-resistant and anti-adhesion features. The tools are most appropriate for the machining of such nonferrous metals as titanium, magnesium, and copper. The tools can also be used for the cutting of materials containing hard particles such as graphite and organic and other materials, the machining of printed circuit boards, and the bimetallic cutting of a ferrous material adhered to aluminum. Furthermore, due to their high hardness, the amorphous carbon films can be optimized in tools for the processing not only of nonferrous materials, but also of stainless and other steel and castings.

Specific Example of Tools

The amorphous carbon coated tools recited in the present invention may find particular utility in applications involving tools selected from the group of drills, endmills, metal saws, gear cutting tools, reamers, taps, and indexable inserts used in the endmilling, milling cutting, and turning processing.

As described heretofore, coated tools produced according to the present invention can maintain wear resistance and improve their anti-adhesion feature, as said tools employ substrates of specific compositions and amorphous carbon films having a specific thickness. Furthermore, it is also possible to extend the cutting length and the lifetime of said tools. Manufacturing an amorphous carbon film containing little hydrogen makes it possible to further improve the resistance to wear and adhesion of the tools. In light of this, it is anticipated that the present invention may find particular utility in applications to an indexable insert used for example in turning tools and face milling cutter and milling cutters (including drills, endmills, and reamers), as well as for cutting tools (represented by cutters, knives, and slitters).

DESCRIPTION OF THE PREFERRED EMBODIMENTS

Amorphous carbon coated tools produced according to the present invention are described in detail by using Example Embodiments. However, conceivable embodiments are not limited to those herein provided, and any other means employing physical vapor deposition of graphite is deemed effective.

EXAMPLE 1

Cemented carbide drills with an 8 mm diameter wherein substrates of sintered bodies were brazed on the cutting edges were prepared. The following is a description of the sintered bodies (Types A to H) employed as the substrates in the Example Embodiments.

Types of sintered bodies

A: A sintered body containing diamond particles with a particle size from 0.1 μm or more to 2 μm or less at 93 volume percent, and the remaining part comprising Co, WC, and inevitable impurities.

B. A sintered body containing diamond particles with a particle size from 0.1 μm or more to 2 μm or less at 80 volume percent, and the remaining part comprising pores, WC, and inevitable impurities.

C. A sintered body containing diamond particles with a particle size from 0.1 μm or more to 2 μm or less at 90 volume percent, and the remaining part comprising Co, TiC, WC, and inevitable impurities.

D. A sintered body containing diamond particles with a particle size from 0.1 μm or more to 2 μm or less at 98 volume percent, and the remaining part comprising SiC, WC, and inevitable impurities.

E. A sintered body containing cBN particles with a particle size from 0.1 μm or more to 5 μm or less at 70 volume percent, and the remaining part being Co, inevitable impurities, and a binder formed from TiN, $TiB_2$, AlN, $AlB_2$, WC, and $Al_2O_3$.

F. A sintered body containing cBN particles with a particle size from 0.1 μm or more to 5 μm or less at 80 volume percent, and the remaining part being inevitable impurities and a binder formed from AlN, $AlB_2$, and $Al_2O_3$.

G. A sintered body containing silicon nitride particles with an average size of 1.5 μm at 95 volume percent, and the remaining part being a binder formed from $Al_2O_3$, AlN, MgO, TiN, and TiC, and inevitable impurities.

H. A sintered body containing aluminum oxide particles with an average size of 1.5 μm in at 67 volume percent and titanium nitride particles with an average size of 1.5 μm at 28 volume percent, and the remaining part being a binder of MgO and CaO, and inevitable impurities.

A known method of cathode arc ion plating was conducted for the surface of said substrates to prepare amorphous carbon coated drills (Samples 1 to 21) according to the present invention as shown in Table 1.

Figure 1:
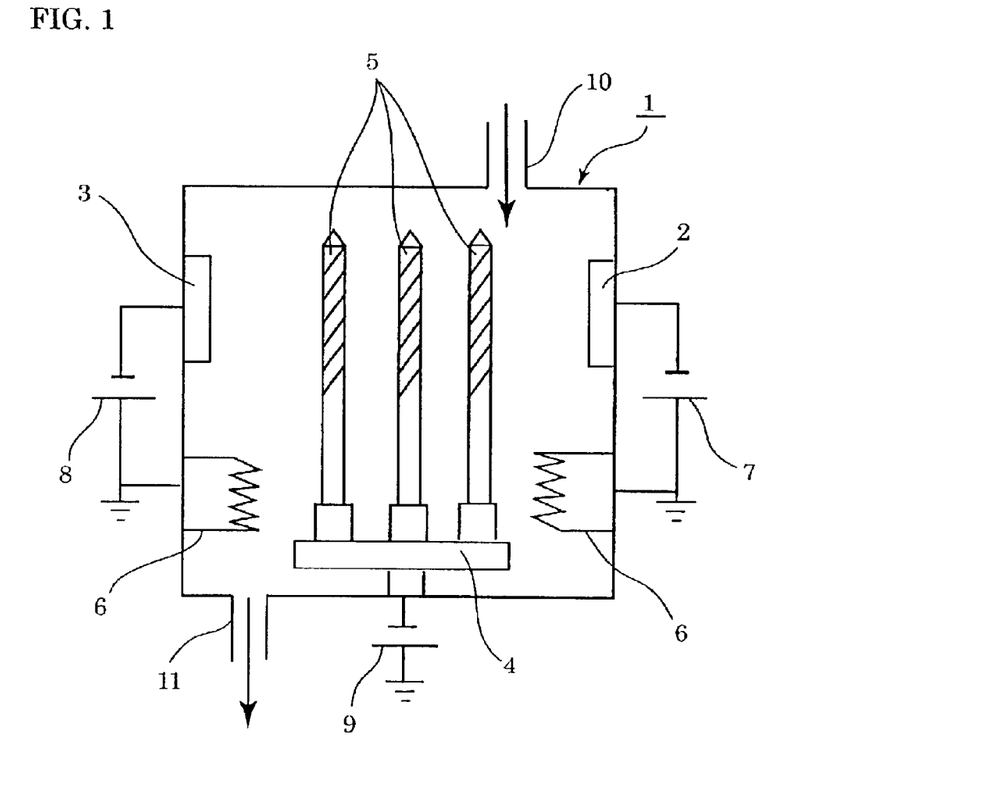
FIG. 1 is a schematic view of a vacuum chamber used in the film formation process according to the present invention.

As indicated in FIG. 1, a plurality of targets 2 and 3 were placed inside a vacuum chamber 1. Cemented carbide drills 5 wherein the aforementioned sintered bodies were brazed on the cutting edges were installed on a substrate holder 4. The substrate holder was rotatable in the middle of said targets 2 and 3. Power sources 7 and 8 were adjusted to change ion arc electric discharge. The amount of evaporated target material was controlled while amorphous carbon formed films on the drills.

First, substrate heaters 6 were used to increase the temperature to 100° C. while the vacuum level inside the vacuum chamber 1 was adjusted to $2\times10^{-3}$ Pa. Argon gas was then supplied to the vacuum chamber 1, while the atmosphere therein was held at the vacuum level of $2\times10^{-1}$ Pa. At the same time, argon plasma cleaning was carried out on the substrate holder 4 by applying −1000 volts from a bias power source 9 before the discharge of argon gas. Gas was supplied through a gas inlet 10, and discharged through an exhaust port 11.

Secondly, prior to the deposition of amorphous carbon films, targets of a metal element belonging to the IVa, Va, VIa, and IIIb groups in the periodic table were evaporated and ionized. At the same time, −1000 volts were applied to the substrate holder 4 from the bias power source 9 to carry out metal ion bombardment. Etching was also conducted for the surface of the films for further strengthened adherence.

With or without the introduction of hydrocarbon gas, the targets comprising one element selected from the group consisting of an element from groups IVa, Va, VIa, IIIb of the periodic table and an element from group IVb except C in the periodic table were evaporated and ionized. Voltages of a few hundred negative volts were applied from the bias power source 9 to the substrate holder 4 to cause either the metals or the metal carbides to form interlayers. The interlayer and amorphous carbon films were formed as a result of changing the targets and the atmosphere. Such changes usually cause two layers to mix compositions, albeit slightly. It can be deduced, therefore, that there exists a mixed composition layer or a gradient composition layer between the two layers.

Evaporating and ionizing the targets of graphite through cathode arc electric discharge permitted amorphous carbon films to form on, and in contact with, cemented carbide drills. The voltages applied from the bias power source 9 were set as a few hundred negative volts. The temperature of the cemented carbide drills was 100° C.

For comparison, coated drills (Comparative Examples 1 to 8) were prepared as shown in FIG. 1. Sintered bodies employed in the Comparative Examples were of Type A. Comparative Example 1 was the same cemented carbide drill as provided heretofore, and had a hydrogenated amorphous carbon film formed thereon by the use of a conventional plasma CVD film deposition apparatus that employed $CH_4$ gas as a raw material. Comparative Examples 2 to 4 were the same cemented carbide drills as provided heretofore, and each said drill had an amorphous carbon film formed thereon through the cathode arc ion plating method employing graphite as a raw material. However, the films in Comparative Examples 2 to 4 did not have a thickness in the range herein specified. Comparative Example 5 was the same cemented carbide drill as provided heretofore, and had a hydrogenated amorphous carbon film formed thereon through the cathode arc ion plating method wherein $CH_4$ gas was added to the atmosphere. However, the amount of hydrogen contained in the film was out of the range herein specified. Comparative Examples 6 and 7 were the same cemented carbide drills as provided heretofore, and had coatings respectively formed from TiN and TiAlN through the cathode arc ion plating method. Comparative Example 8 was a drill having no film thereon.

Then, a drilling test was conducted under the conditions specified in Table III (wet conditions with oil supply from outside) for each of the drills produced in the aforementioned methods. Concerning each said drill, a reduction ratio of thrust resistance was measured in comparison with Comparative Example 8 as a standard. Examination was also made concerning the presence of corroded workpiece material adhered to the cutting edge thereof. The results of the drilling test are disclosed in Table II. The amount of hydrogen in the obtained amorphous carbon film was evaluated through the Elastic Recoil Detection Analysis (ERDA). The thickness of each said film on the cutting edge was measured by conducting SEM observation of the cross section of the cutting edge.

TABLE I

|  | Film deposition method | Amount of hydrogen contained in film (atomic %) | Maximum thickness of film on cutting edge ($\mu$m) | Color of film on cutting edge | Type of substrate | Surface roughness Ra ($\mu$m) | Surface roughness Ry ($\mu$m) | Macro particle density (count/mm$^2$) | Knoop hardness (GPa) | Component of interlayer |
|---|---|---|---|---|---|---|---|---|---|---|
| Sample 1 | Cathode arc ion plating | 3.5 | 0.05 | Reddish purple | A | 0.002 | 0.02 | 23000 | 23 | Ti |
| Sample 2 | Cathode arc ion plating | 4.9 | 0.07 | Purple | B | 0.003 | 0.05 | 35000 | 24 | TiCx |
| Sample 3 | Cathode arc ion plating | 2.2 | 0.08 | Bluish purple | C | 0.004 | 0.06 | 41000 | 21 | Zr |
| Sample 4 | Cathode arc ion plating | 1.3 | 0.10 | Blue | D | 0.005 | 0.08 | 52000 | 22 | ZrCx |
| Sample 5 | Cathode arc ion plating | 1.1 | 0.12 | Silver | E | 0.006 | 0.09 | 57000 | 35 | Cr |
| Sample 6 | Cathode arc ion plating | 0.7 | 0.15 | Yellow | F | 0.008 | 0.11 | 72000 | 31 | CrCx |
| Sample 7 | Cathode arc ion plating | 1.4 | 0.20 | Red | G | 0.009 | 0.12 | 110000 | 34 | V |
| Sample 8 | Cathode arc ion plating | 0.4 | 0.25 | Blue | H | 0.015 | 0.19 | 125000 | 36 | VCx |
| Sample 9 | Cathode arc ion plating | 0.1 | 0.30 | Green | A | 0.021 | 0.23 | 153000 | 39 | Nb |
| Sample 10 | Cathode arc ion plating | 0.3 | 0.35 | Yellow | B | 0.026 | 0.32 | 172000 | 40 | NbCx |
| Sample 11 | Cathode arc ion plating | Not detectable | 0.40 | Red | A | 0.029 | 0.35 | 212000 | 42 | Ta |
| Sample 12 | Cathode arc ion plating | Not detectable | 0.45 | Blue | B | 0.035 | 0.39 | 251000 | 43 | TaCx |
| Sample 13 | Cathode arc ion plating | Not detectable | 0.50 | Green | F | 0.045 | 0.41 | 259000 | 46 | Hf |
| Sample 14 | Cathode arc ion plating | Not detectable | 0.05 | Reddish purple | F | 0.003 | 0.02 | 24000 | 48 | HfCx |
| Sample 15 | Cathode arc ion plating | Not detectable | 0.07 | Purple | G | 0.003 | 0.04 | 31000 | 47 | Mo |
| Sample 16 | Cathode arc ion plating | Not detectable | 0.08 | Bluish purple | H | 0.004 | 0.06 | 39000 | 47 | MoCx |
| Sample 17 | Cathode arc ion plating | 1.4 | 0.10 | Blue | A | 0.006 | 0.08 | 49000 | 23 | W |
| Sample 18 | Cathode arc ion plating | 2.3 | 0.12 | Silver | B | 0.007 | 0.09 | 62000 | 23 | WCx |
| Sample 19 | Cathode arc ion plating | 3.5 | 0.15 | Yellow | C | 0.009 | 0.11 | 71000 | 25 | Si |
| Sample 20 | Cathode arc ion plating | 1.9 | 0.20 | Red | D | 0.015 | 0.17 | 120000 | 26 | SiCx |
| Sample 21 | Cathode arc ion plating | 2.2 | 0.15 | Yellow | F | 0.009 | 0.10 | 73000 | 30 | N.A. |
| Comparative Example 1 | Plasma CVD | 40 | 0.30 | Dark brown | A | 0.003 | 0.04 | 0 | 12 | Si |
| Comparative Example 2 | Cathode arc ion plating | 1.6 | 0.03 | Brown | A | 0.002 | 0.03 | 21000 | 31 | TiCx |
| Comparative Example 3 | Cathode arc ion plating | 0.4 | 0.60 | Red | F | 0.061 | 0.63 | 330000 | 34 | VCx |
| Comparative Example 4 | Cathode arc ion plating | 2.2 | 1.00 | Gray | G | 0.082 | 0.83 | 395000 | 32 | ZrCx |
| Comparative Example 5 | Cathode arc ion plating | 32 | 0.15 | Gray | A | 0.007 | 0.07 | 76000 | 14 | CrCx |
| Comparative Example 6 | Cathode arc ion plating | N.A. | TiN 3 $\mu$m | Gold | A | 0.211 | 0.82 | N.A. | 21 | N.A. |
| Comparative Example 7 | Cathode arc ion plating | N.A. | TiAlN 3 $\mu$m | Reddish brown | A | 0.183 | 1.23 | N.A. | 24 | N.A. |
| Comparative Example 8 | N.A. | N.A. | N.A. | N.A. | A | N.A. | N.A. | N.A. | N.A. | N.A. |

N.A. indicates "not available"
x: written in the column of "Component of Interlayer" indicate atomic ratio to a metal element

TABLE II

| | Raman Spectrum | | | | | Reduction ratio in | Presence of | |
| --- | --- | --- | --- | --- | --- | --- | --- | --- |
| | Presence of peaks below | Intensity indices I = intensity S = integral intensity | | | | Wave number where peak | thrust resistance compared with | corroded workpiece material on | Wear or peeling |
| | 1,000 cm⁻¹ | I700/I1340 | S700/S1340 | I1340/I1560 | S1340/S1560 | around 1560 cm⁻¹ appeared | Comparative Example 8 | cutting edge | of film |
| Sample 1 | Yes | 0.03 | 0.02 | 1.2 | 2.7 | 1560 | 41 | No | No |
| Sample 2 | Yes | 0.04 | 0.03 | 1 | 2.4 | 1561 | 43 | No | No |
| Sample 3 | Yes | 0.06 | 0.05 | 0.7 | 2.2 | 1562 | 42 | No | No |
| Sample 4 | Yes | 0.08 | 0.07 | 0.8 | 2.2 | 1563 | 45 | No | No |
| Sample 5 | Yes | 0.11 | 0.08 | 0.3 | 0.3 | 1565 | 47 | No | No |
| Sample 6 | Yes | 0.35 | 0.19 | 0.1 | 0.4 | 1571 | 51 | No | No |
| Sample 7 | Yes | 0.27 | 0.12 | 0.2 | 0.5 | 1569 | 48 | No | No |
| Sample 8 | Yes | 0.24 | 0.17 | 0.4 | 0.6 | 1575 | 54 | No | No |
| Sample 9 | Yes | 0.35 | 0.13 | 0.3 | 0.3 | 1574 | 56 | No | No |
| Sample 10 | Yes | 0.36 | 0.11 | 0.4 | 0.5 | 1572 | 61 | No | No |
| Sample 11 | Yes | 0.41 | 0.65 | 0.2 | 0.4 | 1576 | 65 | No | No |
| Sample 12 | Yes | 0.77 | 0.87 | 0.3 | 0.6 | 1578 | 67 | No | No |
| Sample 13 | Yes | 1.3 | 1.3 | 0.2 | 0.5 | 1580 | 69 | No | No |
| Sample 14 | Yes | 2.3 | 2.2 | 0.2 | 0.3 | 1576 | 45 | No | No |
| Sample 15 | Yes | 2.1 | 1.9 | 0.2 | 0.4 | 1573 | 42 | No | No |
| Sample 16 | Yes | 1.1 | 0.9 | 0.1 | 0.3 | 1576 | 41 | No | No |
| Sample 17 | Yes | 0.03 | 0.02 | 1 | 2.8 | 1562 | 46 | No | No |
| Sample 18 | Yes | 0.13 | 0.08 | 1.1 | 2.3 | 1561 | 48 | No | No |
| Sample 19 | Yes | 0.21 | 0.17 | 0.9 | 2.4 | 1566 | 51 | No | No |
| Sample 20 | Yes | 0.26 | 0.25 | 0.5 | 2.1 | 1565 | 46 | No | No |
| Sample 21 | Yes | 0.35 | 0.18 | 0.1 | 0.3 | 1568 | 50 | No | No |
| Comparative Example 1 | No | 0 | 0 | 2.2 | 4.3 | 1558 | 99 | Accumulation confirmed present | Worn |
| Comparative Example 2 | Yes | 0.23 | 0.14 | 0.9 | 0.5 | 1571 | 97 | Accumulation confirmed present | Worn |
| Comparative Example 3 | Yes | 0.25 | 0.13 | 0.4 | 0.6 | 1572 | 102 | Accumulation confirmed present | No |
| Comparative Example 4 | Yes | 0.21 | 0.11 | 0.5 | 0.8 | 1575 | 103 | Accumulation confirmed present | Peeling |
| Comparative Example 5 | No | 0 | 0 | 1.9 | 3.6 | 1556 | 95 | Accumulation confirmed present | Worn |
| Comparative Example 6 | No | N.A. | N.A. | N.A. | N.A. | N.A. | 136 | Chipping observed | No |
| Comparative Example 7 | No | N.A. | N.A. | N.A. | N.A. | N.A. | 147 | Chipping observed | No |
| Comparative Example 8 | N.A. | N.A. | N.A. | N.A. | N.A. | N.A. | 100 | Chipping observed | N.A. |

N.A. indicates "not available"

TABLE III

| | |
| --- | --- |
| Workpiece material machined | A5052 |
| Cutting speed | 100 m/min. |
| Feed rate | 0.5 mm/rev |
| Cutting depth | 40 mm |
| Number of holes | 1000 holes |

(A5052: Japanese Industrial Standards H4000)

According to the results shown in Table II, the TiN film (Comparative Example 6) and the TiAlN film (Comparative Example 7) both conventionally used; and the amorphous carbon films of Comparative Examples 1 to 5 deviating from the specified standard range had the same level of thrust resistance as did Comparative Example 8 without a coating. Comparative Examples 1 to 7 were inferior to Comparative Example 8 in terms of protecting the cutting edge from the accumulation of the corroded workpiece material. In contrast, it is apparent that the drills produced according to the present invention (Samples 1 to 21) demonstrated excellent wear resistance to the drilling of aluminum and caused less aluminum to corrode and accumulate on the cutting edges. This also reaffirms that said drills achieved high precision in the drilling processing and may last longer.

EXAMPLE 2

In the same method employed in Example 1, an amorphous carbon film of sample 4 was formed on the substrate of a cemented carbide reamer with a 4 mm diameter, wherein the diamond sintered body of Type A was brazed on the cemented carbide reamer as a substrate. Said diamond sintered body was placed in a closed container together with a nitric-hydrofluoric acid comprising a 30 mol % nitric acid and a 45 mol % hydrofluoric acid respectively at the ratio of 4 to 1. Then, the sintered body was maintained for 12 hours at the temperature of 130° C. to elute components other than diamond. Thereafter, the sintered body was brazed to said cemented carbide reamer. For comparison, the same type of cemented carbide reamers were prepared and are indicated in Comparative Examples 1 to 8. Comparative Example 1 was coated by a hydrogenated amorphous carbon film produced through the CVD method. Comparative Examples 2 to 4 were covered with amorphous carbon films having a thickness out of the present invention. Comparative Example 5 was coated by a hydrogenated amorphous carbon film manufactured through the cathode arc ion plating method, wherein CH4 was added to the atmosphere gas. Comparative Examples 6 and 7 were covered respectively by a TiN film and a TiAlN film. Comparative Example 8 had no coating thereon.

Secondly, drilling tests were conducted by the use of aluminum die cast (ADC12) under the conditions provided in Table IV concerning said reamers coated with the films respectively produced by the aforementioned methods. Thereafter, the hole counts and the state of the cutting edges were examined.

TABLE IV

| Workpiece material machined | ADC12 |
|---|---|
| Cutting speed | 230 m/min. |
| Feed rate | 0.15 mm/rev |
| Cutting depth | 15 mm |

(ADC12: the Japanese Industrial Standards H5302)

As a result of the tests, Comparative Examples 1 to 7 found varied hole diameters when the hole counts reached 600. Examination of the reamers revealed that the cutting edges were worn and partly chipped on the tips. As for Comparative Example 8 having no coating, it was found that chipping occurred to the cutting edge soon after the drilling test began when the count reached 3.

On the other hand, the reamer coated with the amorphous carbon film produced according to the present invention (Sample 4) did not experience any problems in machining the workpiece material when the hole count reached 9500. No sign of wear or chipping was observed.

EXAMPLE 3

In the same method employed in Example 1, an amorphous carbon film (Sample 6) was formed on the surface of an insert for the endmill processing, wherein a sintered body (Type E) was brazed to a substrate of the cemented carbide insert. The insert was manufactured in a shape specified as TPGN160304 according to the ISO. For comparison, the same type of inserts were made available and covered respectively by a hydrogenated amorphous carbon film produced through the CVD method (Comparative Example 1); amorphous carbon films having a thickness out of the standard range herein provided (Comparative Examples 2 to 4); a hydrogenated amorphous carbon film formed through cathode arc ion plating wherein $CH_4$ gas was added to the atmosphere (Comparative Example 5); a TiN film (Comparative Example 6); and a TiAlN film (Comparative Example 7).

Next, endmills coated with said films produced in the aforementioned manner were tested in the endmill processing of aluminum die cast (ADC12) under the conditions specified in Table V. The cutting length and the state of the tool edges were evaluated individually until the surface roughness of the machined workpiece material began to deviate from the standard herein provided.

TABLE V

| Workpiece material machined | ADC12 |
|---|---|
| Cutting speed | 300 m/min. |
| Feed rate | 0.1 mm/rev |
| Cutting depth | Ad = Rd = 5 mm |

Ad: axial depth of the cuts
Rd: radial depth of the cuts

The following are the test results (cutting length) of the endmills coated by the use of the conventional art. Comparative Example 1 having the hydrogenated amorphous carbon film produced through chemical vapor deposition recorded 25 meters of cutting length while Comparative Examples 2 to 4 having the amorphous carbon films whose thickness was out of the standard range herein specified recorded 80 meters of cutting length. Comparative Example 5 having the hydrogenated amorphous carbon film deposited through cathode arc ion plating with $CH_4$ gas added to the atmosphere achieved a cutting length of 35 meters Comparative Examples 6 and 7 with PVD-produced metal nitride films thereon cut respectively 9 meters of cutting length and 5 meters of cutting length until they began deviating from the specified standard of the surface roughness at which point a judgment was made that their lifetime ended. Thereafter, the tools of Comparative Example 6 and 7 were examined after the removal of aluminum adhered to the tip thereof. The deposited films were no longer present and the substrates of cBN sintered bodies underneath were exposed.

On the other hand, the endmill of Sample 6 maintained the surface roughness of the machined material within the specified standard range when the cutting length reached 800 meters. The tool may be considered to last longer.

EXAMPLE 4

In the same method employed in Example 1, an amorphous carbon film (Sample 2) was deposited on the substrate of a cemented carbide insert, wherein a diamond sintered body was brazed to make an indexable insert as the substrate. In Example 4, the sintered body of Type A was employed as a substrate. For comparison, the cemented carbide inserts of the same type were coated respectively with a hydrogenated amorphous carbon film formed through chemical vapor deposition (Comparative Example 1), a TiN film (Comparative Example 6), and a TiAlN film (Comparative Example 7). Next, each of the coated indexable inserts produced in the aforementioned manner was incorporated in a holder with a diameter of 32 mm and used for the endmill processing of aluminum die cast (A390) under the conditions provided in Table VI. Then, the cutting length and the state of the cutting edges were evaluated until the surface roughness of the machined material began to deviate from the standard herein provided.

TABLE VI

| Workpiece material machined | A390 |
|---|---|
| Cutting speed | 200 m/min. |
| Feed rate | 0.1 mm/rev |
| Cutting depth | Ad = Rd = 3 mm |

A390: Al-16~18% wt % Si
Ad: axial depth of the cuts
Rd: radial depth of the cuts The results of the aforementioned tests are as follows. The hydrogenated amorphous carbon film produced through chemical vapor deposition (Comparative Example 1) recorded a cutting length of 10 meters of cutting length. The PVD-produced metal nitride films (Comparative Examples 6 and 7) cut respectively 3 meters of cutting length and 4 meters of cutting length until the surface roughness of the machined material began to deviate from the standard herein specified. At this point a judgment was made that the lifetime of the tools ended. After the removal of aluminum from the coated drills, the surface of the cutting edges of the drills was examined. The films were confirmed to be no longer present and the substrates beneath were exposed.

The endmill of Sample 2 began to deviate from the standard specified in respect of the surface roughness of the material machined, when the cutting length reached 700 meters. At this point, a judgment was made that the lifetime of the tool ended.

While example embodiments have been herein disclosed, it should be understood that they are not intended to limit the disclosure, but rather to cover all modifications and present alternate methods falling within the spirit and the scope of the invention as defined in the appended claims and their equivalents.

Aside from the foregoing examples, the present invention is applicable to an indexable insert used for example in other types of turning tools (represented by drills, endmills, and reamers), milling cutters, and in other types of cutting tools (including cutters, knives, and slitters).

What is claimed is:

1. An amorphous carbon coated tool comprising:
a substrate consisting of a body selected from the group consisting of a cubic boron nitride sintered body, a diamond sintered body, a silicon nitride sintered body, and an aluminum oxide-titanium carbide sintered body;
an interlayer disposed directly on said substrate, wherein said interlayer comprises at least one carbide of at least one element selected from the group consisting of Ti, Zr, Hf, V, Nb, Ta, Cr, Mo, w, and Si, and wherein said interlayer has a thickness in a range from 0.5 nm to less than 10 nm; and
an amorphous carbon film that: is disposed indirectly on said substrate with said interlayer therebetween; covers at least a cutting edge of said substrate; contains at most 5 atomic percent of hydrogen; has a maximum thickness in a range from 0.05 $\mu$m to 0.5 $\mu$m on a tool edge of said substrate; has a density of up to $3 \times 10^5$ particles/$mm^2$ of macro particles comprising carbon on a surface of said amorphous carbon film; has a peak in a wave number region from 400 $cm^{-1}$ to 1000 $cm^{-1}$ in a Raman spectrograph obtained by Raman spectroscopy using an argon ion laser with a wavelength of 514.5 nm; is transparent in a visible light range; and exhibits an interference color selected from the group consisting of reddish purple, purple, bluish purple, blue, Silver, yellow, red and green.

2. The amorphous carbon coated tool according to claim 1, wherein said amorphous carbon film substantially consists solely of carbon.

3. The amorphous carbon coated tool according to claim 1, wherein said maximum thickness is no more than 0.25 $\mu$m, and wherein said tool edge on which said amorphous carbon film has said maximum thickness is said cutting edge which is relevant to carrying out a cutting process with said tool.

4. The amorphous carbon coated tool according to claim 1, wherein said amorphous carbon film has a surface roughness Ra of 0.002 $\mu$m to 0.05 $\mu$m.

5. The amorphous carbon coated tool according to claim 1, wherein said amorphous carbon film has a surface roughness Ry of 0.02 $\mu$m to 0.5 $\mu$m.

6. The amorphous carbon coated tool according to claim 1, wherein said amorphous carbon film has a Knoop hardness of 20 GPa to 50 GPa.

7. The amorphous carbon coated tool according to claim 1, wherein said amorphous carbon film has a (I700/I1340) ratio of the intensity of a peak present in the wave number region from 400 $cm^{-1}$ to 1000 $cm^{-1}$ (I700) relative to the intensity of another peak found around 1340 $cm^{-1}$ (I1340) in said Raman spectrograph, said ratio being in the range from 0.02 to 2.5.

8. The amorphous carbon coated tool according to claim 1, wherein said amorphous carbon film has a (S700/S1340) ratio of the integral intensity of a peak present in the wave number region from 400 $cm^{-1}$ to 1000 $cm^{-1}$ (S700) relative to the integral intensity of another peak present around 1340 $cm^{-1}$ (S1340) in said Raman spectrograph, said ratio being in the range from 0.01 to 2.5.

9. The amorphous carbon coated tool according to claim 1, wherein said amorphous carbon film has a (I1340/I1560) ratio of the intensity of a peak present around 1340 $cm^{-1}$ (I1340) relative to the intensity of another peak present around 1560 $cm^{-1}$ (I1560) in said Raman spectrograph, said ratio being in the range from 0.1 to 1.2.

10. The amorphous carbon coated tool according to claim 1, wherein said amorphous carbon film has a (S1340/S1560) ratio of the integral intensity of a peak present around 1340 $cm^{-1}$ (S1340) relative to the integral intensity of another peak present around 1560 $cm^{-1}$ (S1560) in said Reman spectrograph, said ratio being in the range from 0.3 to 3.

11. The amorphous carbon coated tool according to claim 1, wherein said amorphous carbon film has a peak present at around 1560 $cm^{-1}$ in the wave number range from 1560 $cm^{-1}$ to 1580 $cm^{-1}$ in said Raman spectrograph.

12. The amorphous carbon coated tool according to claim 1, further comprising either a mixed composition layer having a mixed component deriving from said interlayer and from said carbon film, or a gradient composition layer having a gradually changing composition, disposed between said interlayer and said amorphous carbon film.

13. The amorphous carbon coated tool according to claim 1, adapted to carry out processing of workpiece materials comprising at least one of soft metals, nonferrous metals, organic materials, materials containing hard particles, and printed circuit boards, or bi-metallic cutting of a ferrous material and a soft metal.

14. The amorphous carbon coated tool according to claim 1, being a tool selected from the group consisting of drills, micro drills, endmills, an indexable insert for endmill processing, metal saws, gear cutting tools, reamers, taps, and an indexable insert for endmilling, milling cutting, and turning processing.

15. The amorphous carbon coated tool according to claim 1, wherein said substrate consists of said cubic boron nitride sintered body.

16. The amorphous carbon coated tool according to claim 1, wherein said substrate consists of said diamond sintered body.

17. The amorphous carbon coated tool according to claim 1, wherein said substrate consists of said silicon nitride sintered body.

18. The amorphous carbon coated tool according to claim 1, wherein said substrate consists of said aluminum oxide-titanium carbide sintered body.

* * * * *

UNITED STATES PATENT AND TRADEMARK OFFICE
CERTIFICATE OF CORRECTION

PATENT NO. : 6,962,751 B2
DATED : November 8, 2005
INVENTOR(S) : Fukui et al.

It is certified that error appears in the above-identified patent and that said Letters Patent is hereby corrected as shown below:

<u>Title page,</u>
Item [75], Inventors, replace "Itami" by -- Itami-shi --;
replace "Kyoto" by -- Kyoto-shi --;

<u>Column 2,</u>
Lines 17 and 51, after "the", replace "bimetallic" by -- bi-metallic --;

<u>Column 6,</u>
Line 9, after "of", replace "$sp_3$" by -- $sp^3$ --;
Line 14, before "is", replace "graghite" by -- graphite --;

<u>Column 8,</u>
Line 22, after "1000", replace "$cm^{-11}$" by -- $cm^{-1}$ --;

<u>Column 10,</u>
Line 45, after "the", replace "bimetallic" by -- bi-metallic --;

<u>Column 11,</u>
Line 53, after "μm", delete -- in --;

<u>Column 13,</u>
Line 13, Table 1, in Sample 13 under "Type of substrate", replace "F" by -- E --;

<u>Column 18,</u>
Line 20, after "meters", insert -- . --;

<u>Column 19,</u>
Line 35, after "Mo,", replace "w," by -- W, --;
Line 51, after "blue,", replace "Silver," by -- silver, --;

UNITED STATES PATENT AND TRADEMARK OFFICE
CERTIFICATE OF CORRECTION

PATENT NO. : 6,962,751 B2
DATED : November 8, 2005
INVENTOR(S) : Fukui et al.

It is certified that error appears in the above-identified patent and that said Letters Patent is hereby corrected as shown below:

Column 20,
Line 29, after "said", replace "Reman" by -- Raman --.

Signed and Sealed this

Second Day of May, 2006

JON W. DUDAS
*Director of the United States Patent and Trademark Office*